United States Patent
Higashiyama et al.

[11] Patent Number: 5,818,301
[45] Date of Patent: Oct. 6, 1998

[54] POWER AMPLIFIER ARRANGENMENT OF A PLURAL POWER SUPPLY SWITCHING TYPE

[75] Inventors: Katsuhiko Higashiyama, Osaka-fu; Fumio Hori, Fukushima-ken; Seiji Kumaki, Osaka-fu, all of Japan

[73] Assignee: Matsushita Electric Industrial Co., Ltd., Osaka, Japan

[21] Appl. No.: 649,227

[22] Filed: May 17, 1996

[30] Foreign Application Priority Data

May 18, 1995 [JP] Japan ................................. 7-119659

[51] Int. Cl.⁶ .............................. H03F 1/30; H03F 1/152
[52] U.S. Cl. ...................... 330/266; 330/267; 330/289; 330/297; 330/298
[58] Field of Search .......................... 330/207 DP, 266, 330/267, 272, 273, 289, 295, 298, 297

[56] References Cited

U.S. PATENT DOCUMENTS 4,423,389  12/1983  Fushiki .................................. 330/297
5,543,998  8/1996  Higashiyama et al. .

FOREIGN PATENT DOCUMENTS 2-502690  8/1990  Japan .
2-47882  10/1990  Japan .
3-201710  9/1991  Japan .
5126895  5/1993  Japan .
6338734  12/1994  Japan .
9002443  3/1990  WIPO .

OTHER PUBLICATIONS

English Language Abstract of JP 2–47882, Aug. 1983.
English Language Abstract of JP 3–201710 Sep, 1991.

*Primary Examiner*—James B. Mullins
*Attorney, Agent, or Firm*—Greenblum & Bernstein, P.L.C.

[57] ABSTRACT

A power amplifier arrangement for amplifying audio signals to be applied to a number of speakers has a plurality of power amplifiers. A level detector detects a level of a peak value of outputs from the power amplifiers, and produces a control signal when the positive peak value exceeds a predetermined positive level. Two power sources are provided for providing a high voltage power and low voltage power to the speakers. A power transistor turns on in response to the presence of the control signal to provide the high voltage power to the speaker, but turns off in response to the absence of the control signal to provide the low voltage power to the speaker. A temperature detector detects a temperature of the power transistor and produces a disabling signal when the detected temperature is greater than a predetermined temperature to disable the power transistor by switching transistor.

15 Claims, 10 Drawing Sheets

POWER AMPLIFIER ARRANGENMENT OF A PLURAL POWER SUPPLY SWITCHING TYPE

BACKGROUND OF INVENTION

1. Field of the Invention

The present invention relates to a power amplifier arrangement of a plural power supply switching type using power supplies with plural power supply voltage levels, and relates particularly to a power amplifier arrangement suitable for audio signal amplification.

2. Description of the Prior Art

According to the prior art power amplifiers used in connection with loud speakers, two different power sources are used. One from a high voltage source and another from a low voltage source. A switching transistor is used to change between the low and high voltage sources. The audio signal applied to the loud speaker is detected, and when the level of the audio signal exceeds a predetermined level, the switching transistor is so turned as to supply power from the high voltage source, and when the level of the audio signal is below the predetermined level, the switching transistor is so turned as to supply power from the low voltage source.

When the audio signal applied to the loud speaker is maintained at a very high level for a long time, power transistors and some other electronic components will be overheated and destroyed.

SUMMARY OF THE INVENTION

The object of the present invention is therefore to provide a power amplifier arrangement with a temperature control system which can secure the power transistors and other electronic components from being destroyed by the overheating, and yet securing the continuous play of the speaker even when the overheated condition is detected.

To achieve this and other objects, a power amplifier arrangement according to the present invention comprises: a plurality of power amplifiers; a first level detector means for detecting a level of a positive peak value of outputs from said power amplifiers, and for producing a first control signal when said positive peak value exceeds a first predetermined positive level; a first power transistor turned on and off in response to the presence and absence of said first control signal, respectively; a second level detector for detecting a level of a negative peak value of outputs from said power amplifiers, and for producing a second control signal when said negative peak value exceeds a second predetermined negative level; a second power transistor turned on and off in response to the presence and absence of said second control signal, respectively; a first power source for supplying a high positive voltage power to said power amplifiers through said first power transistor; a second power source for supplying a low positive voltage power to said power amplifiers; a third power source for supplying a high negative voltage power to said power amplifiers through said second power transistor; a fourth power source for supplying a low negative voltage power to said power amplifiers; a first temperature detection means for detecting a temperature of said first power transistor and for producing a first disabling signal when the detected temperature is greater than a predetermined temperature; and a first disabling means for disabling said first power transistor in response to said first disabling signal.

The present application is based upon Japanese Patent Application Serial No. 7-119,659, which was filed on May 18, 1995, the entire content of which is expressly incorporated by reference herein.

BRIEF DESCRIPTION OF THE DRAWINGS

The present invention will become more fully understood from the detailed description given below and the accompanying diagrams wherein.

DESCRIPTION OF PREFERRED EMBODIMENTS

First Embodiment

The first embodiment of a power amplifier arrangement according to the first embodiment of the present invention is described in detail below with reference to FIGS. 1–6.

Figure 1:
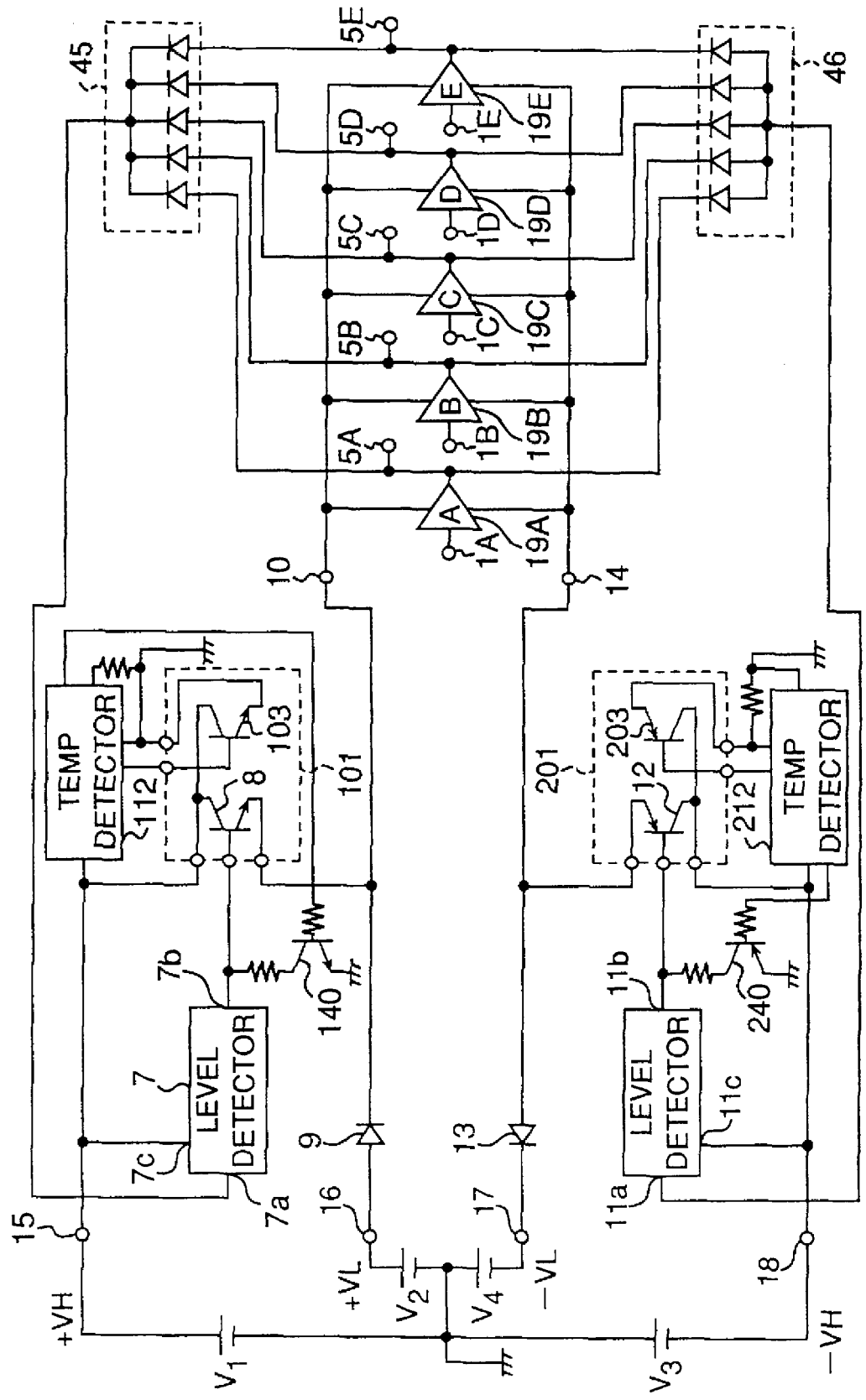
FIG. 1 is a circuit diagram of a power amplifier arrangement according to a first embodiment of the present invention.

FIG. 1 is a block diagram showing the basic configuration of a power amplifier arrangement according to the first embodiment of the present invention.

Figure 6:
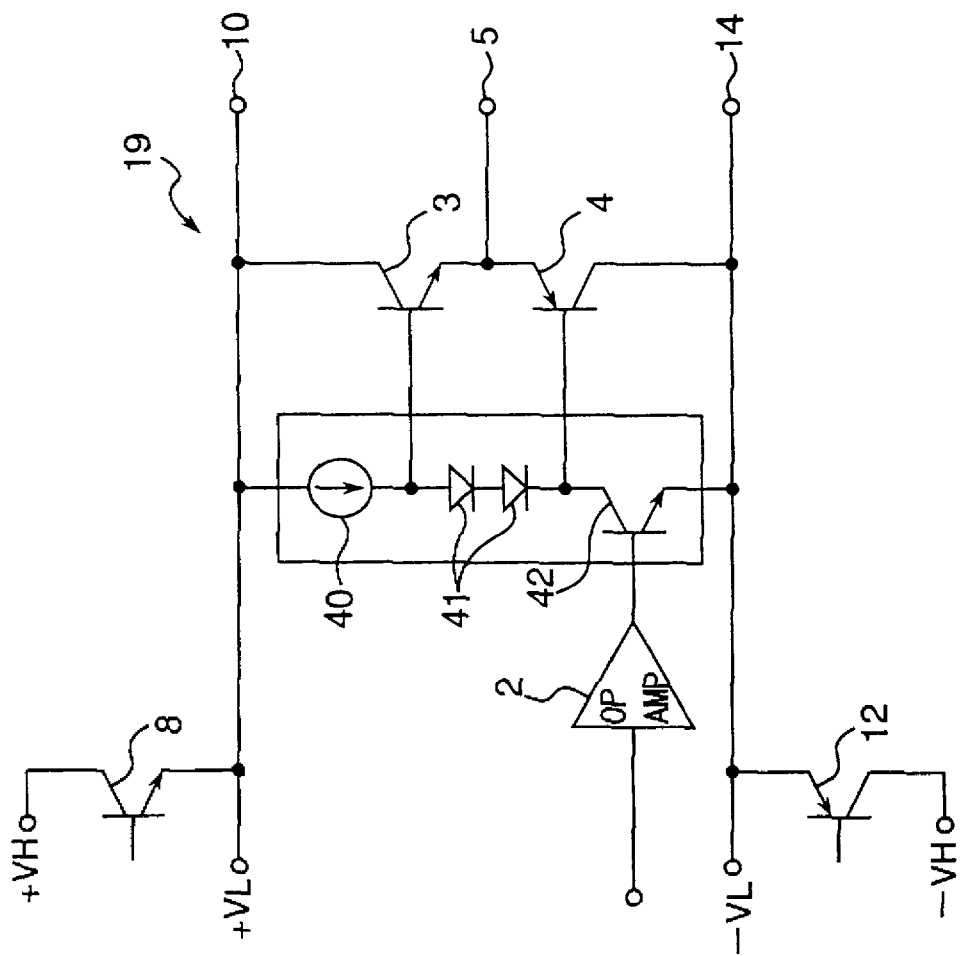
FIG. 6 is a circuit diagram of a power amplifier.

In the example shown in FIG. 1, there are provided five power amplifiers 19A, 19B, 19C, 19D and 19E for amplifying audio signal. Note that each power amplifier 19A, 19B, 19C, 19D, and 19E has a different voltage gain setting. Five power amplifiers I9A, 19B, 19C, 19D and 19E are connected in parallel between two power lines 10 and 14, and are provided with five audio signals 1A, 1B, 1C, 1D and 1E. Five outputs 5A, 5B, 5C, 5D and 5E of the five power amplifiers 19A, 19B, 19C, 19D and 19E are applied to five speakers (not shown), such as front left speaker, front center speaker, front right speaker, rear left speaker and rear right speaker. A detail of each of power amplifiers, generally indicated by reference number 19, is shown in FIG. 6, which will be described later. According to the first embodiment, the outputs 5A, 5B, 5C, 5D and 5E are connected to five diodes, respectively, in a first diode array 45. The outputs (cathode side) of the five diodes in the first diode array 45 are connected together so that the output of the first diode array 45 produces the peak value of the five outputs of the five power amplifiers 19A, 19B, 19C, 19D and 19E in positive side. Similarly, the outputs 5A, 5B, 5C, 5D and 5E are also connected to five diodes, respectively, in a second diode array 46. The outputs (anode side) of the five diodes in diode array 46 are connected together so that the output of the second diode array 46 produces the peak value of the five outputs of the five power amplifiers 19A, 19B, 19C, 19D and 19E in negative side.

Referring to FIG. 6, the power amplifier 19 comprises an operational amplifier 2, a current source 40, dual diodes 41, a transistor 42, and output transistors 3 and 4. Elements 40, 41 and 42 are connected in series between two power lines 10 and 14, and power transistors 3 and 4 are also connected in series between two power lines 10 and 14. The base of transistor 42 is connected to the output of operational amplifier 2, the base of transistor 3 is connected to the output of current source 40, the base of transistor 4 is connected to collector of transistor 42, and a junction between the power transistors 3 and 4 is the output 5 of the power amplifier 19.

Referring back to FIG. 1, the power lines 10 and 14 are arranged so as to selectively supply two different levels of powers. More specifically, the power line 10 can supply either a high voltage power (+VH) or a low voltage power (+VL) in positive side. Similarly, the power line 14 can supply either a high voltage power (−VH) or a low voltage power (−VL) in negative side.

The power line 10 is connected through a diode 9 and terminal 16 to a suitable power source V2 which produces a low voltage power +VL. Similarly, the power line 14 is connected through a diode 13 and terminal 17 to a suitable power source V4 which produces a low voltage power −VL.

The power line 10 is also connected through a power transistor 8 and terminal 15 to a suitable power source V1 which produces a high voltage power +VR. Similarly, the power line 14 is connected through a power transistor 12 and terminal 18 to a suitable power source V3 which produces a high voltage power −VH.

The power transistor 8 is turned on and off by a level detector 7 having an input terminal 7a connected to the output of the first diode array 45, an output terminal 7b connected to the base of the power transistor 8, and a terminal 7c connected to the power line terminal 15. A detail of the level detector 7 is described below.

Figure 2:
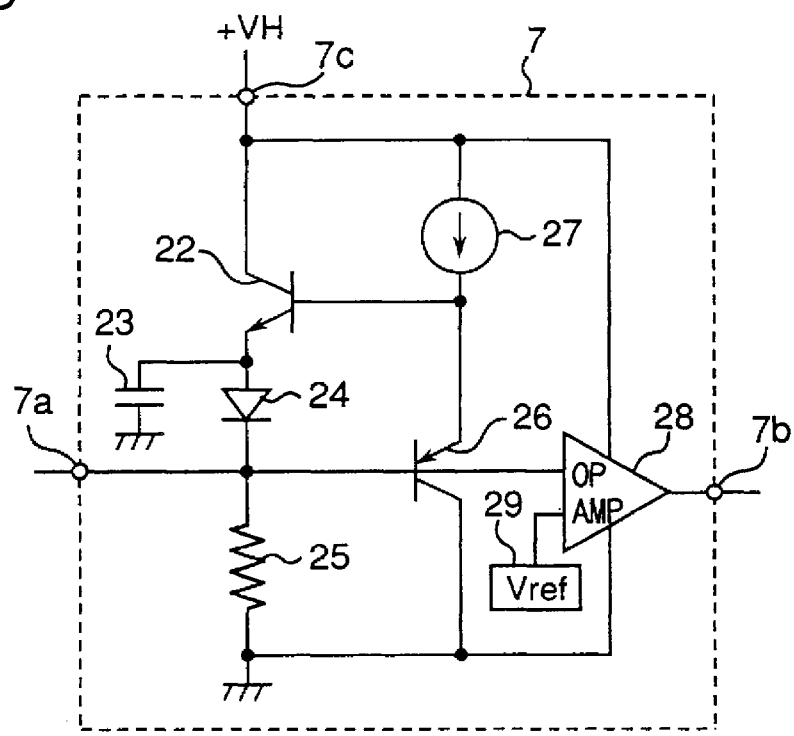
FIGS. 2 and 3 are circuit diagrams respectively showing level detectors used in the power amplifier arrangement of FIG. 1.

Referring to FIG. 2, the level detector 7 comprises a transistor 22, diode 24 and resistor 25 connected in series between the terminal 7c and the ground. A capacitor 23 is connected to the anode of diode 24. The cathode of the diode 24 is connected to the input terminal 7a. A current source 27 and transistor 26 are connected in series between the terminal 7c and the ground. Input terminal 7a is further connected to the base of the transistor 26 and also to one input of comparator 28. The other input of comparator 28 is connected to a reference voltage source 29 which produced a reference voltage +VL±α (α=0 in one embodiment)

The peak audio signal among five outputs 5A, 5B, 5C, 5D and 5E in positive side as produced from the first diode array 45 is applied to input terminal 7a. The peak audio signal applied to the input terminal 7a controls the conductivity of transistor 26 such that as the peak audio signal increases, the conductivity of transistor 26 is reduced to increase a bypass current from current source 27 through transistor 22 to capacitor 23. Thus, capacitor 23 is charged relatively to the peak audio signal, and is discharged through resistor 25 at a rate determined by a time constant of capacitor 23 and resistor 25. In other words, the peak audio signal is peak held by capacitor 23, and is applied to one input of comparator 28. When the peak value applied to one input of comparator 28 exceeds the reference voltage +VL±α, comparator 28 produces a HIGH level signal, and when the peak value applied to one input of comparator 28 becomes lower than the reference voltage +VL±α, comparator 28 produces a LOW is level signal. The output of the comparator 28 is produced from the output terminal 7b of the level detector 7.

Referring back to FIG. 1, the output of the level detector 7 is connected to the base of the power transistor 8. Thus, when the level detector 7 detects that the peak audio signal is greater than the reference voltage +VL±α, the level detector 7 produced a HIGH level signal. Thus, the power transistor 8 is turned-on to enable supply of the high voltage power +VH from the power source V1 to power line 10. On the other hand, when the level detector 7 detects that the peak audio signal is less than the reference voltage +VL±α, the level detector 7 produced a LOW level signal. Thus, the power transistor 8 is turned off to supply of the low voltage power +VL from the power source V2 to power line 10.

Similar to the above, the power transistor 12 is turned on and off by a level detector 11 having an input terminal 11a connected to the output of the second diode array 46, an output terminal 11b connected to the base of the power transistor 12, and a terminal 11c connected to the power line terminal 18. A detail of the level detector 11 is described below.

Figure 3:
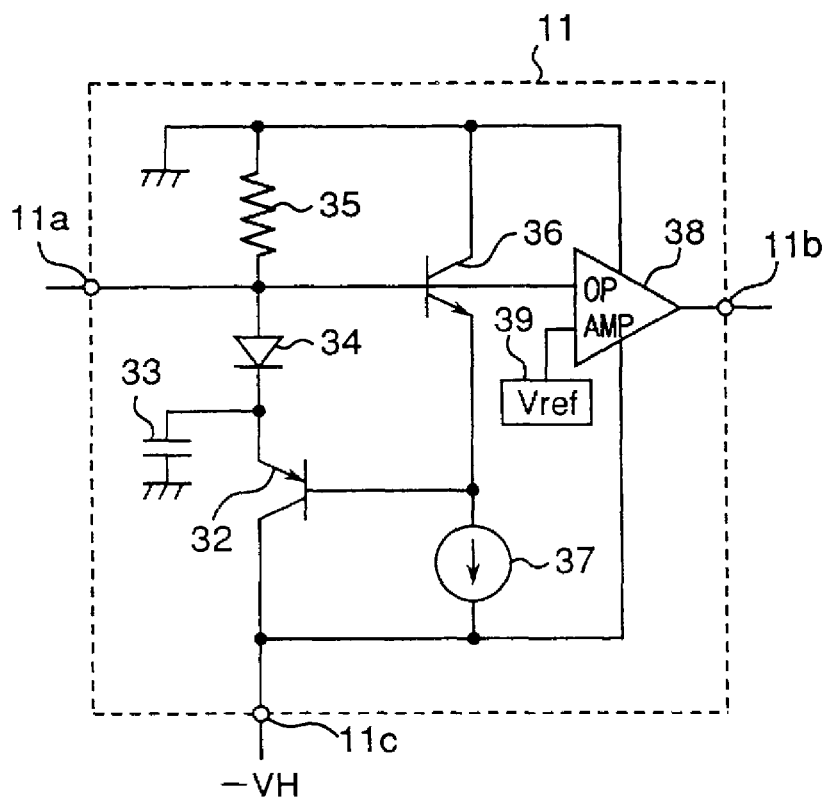

Referring to FIG. 3, the level detector 11 comprises a transistor 32, diode 34 and resistor 35 connected in series between the terminal 11c and the ground. A capacitor 33 is connected to the anode of diode 34. The cathode of the diode 34 is connected to the input terminal 11a. A current source 37 and transistor 36 are connected in series between the terminal 11c and the ground. Input terminal 11a is further connected to the base of the transistor 36 and also to one input of comparator 38. The other input of comparator 38 is connected to a reference voltage source 39 which produced a reference voltage −VL±α (α=0 in one embodiment).

The peak audio signal among five outputs 5A, 5B, 5C, 5D and 5E in negative side as produced from the second diode array 46 is applied to input terminal 11a. The peak audio signal applied to the input terminal 11a controls the conductivity of transistor 36 such that as the peak audio signal increases in negative side, the conductivity of transistor 36 is reduced to increase a bypass current from current source 37 through transistor 32 to capacitor 33. Thus, capacitor 33 is charged relatively to the peak audio signal, and is discharged through resistor 35 at a rate determined by a time constant of capacitor 33 and resistor 35. In other words, the peak audio signal is peak held by capacitor 33, and is applied to one input of comparator 38. When the peak value applied to one input of comparator 38 exceeds in negative side the reference voltage −VL±α, comparator 38 produces a HIGH level signal, and when the peak value applied to one input of comparator 38 becomes lower, in negative side, than the reference voltage −VL±α, comparator 38 produces a LOW level signal. The output of the comparator 38 is produced from the output terminal 11b of the level detector 11.

Referring back to FIG. 1, the output of the level detector 11 is connected to the base of the power transistor 12. Thus, when the level detector 11 detects that the peak audio signal is greater, in negative side, than the reference voltage −VL±α, the level detector 11 produced a HIGH level signal. Thus, the power transistor 12 is turned on to enable supply of the high voltage power −VH from the power source V3 to power line 14. On the other hand, when the level detector 11 detects that the peak audio signal is less, in negative side, than the reference voltage −VL±α, the level detector 11 produced a LOW level signal. Thus, the power transistor 12 is turned off to supply of the low voltage power −VL from the power source V4 to power line 14.

According to the present invention, the power amplifier arrangement further comprises a temperature control system for controlling the on and off operation of the power transistors 8 and 12 relatively to the temperature of the power transistors 8 and 12. The temperature control system for the power transistor 8 comprises a temperature detector 112, a temperature detector transistor 103, and a switching transistor 140, a detail of which is herein described in connection with FIG. 4.

Figure 4:
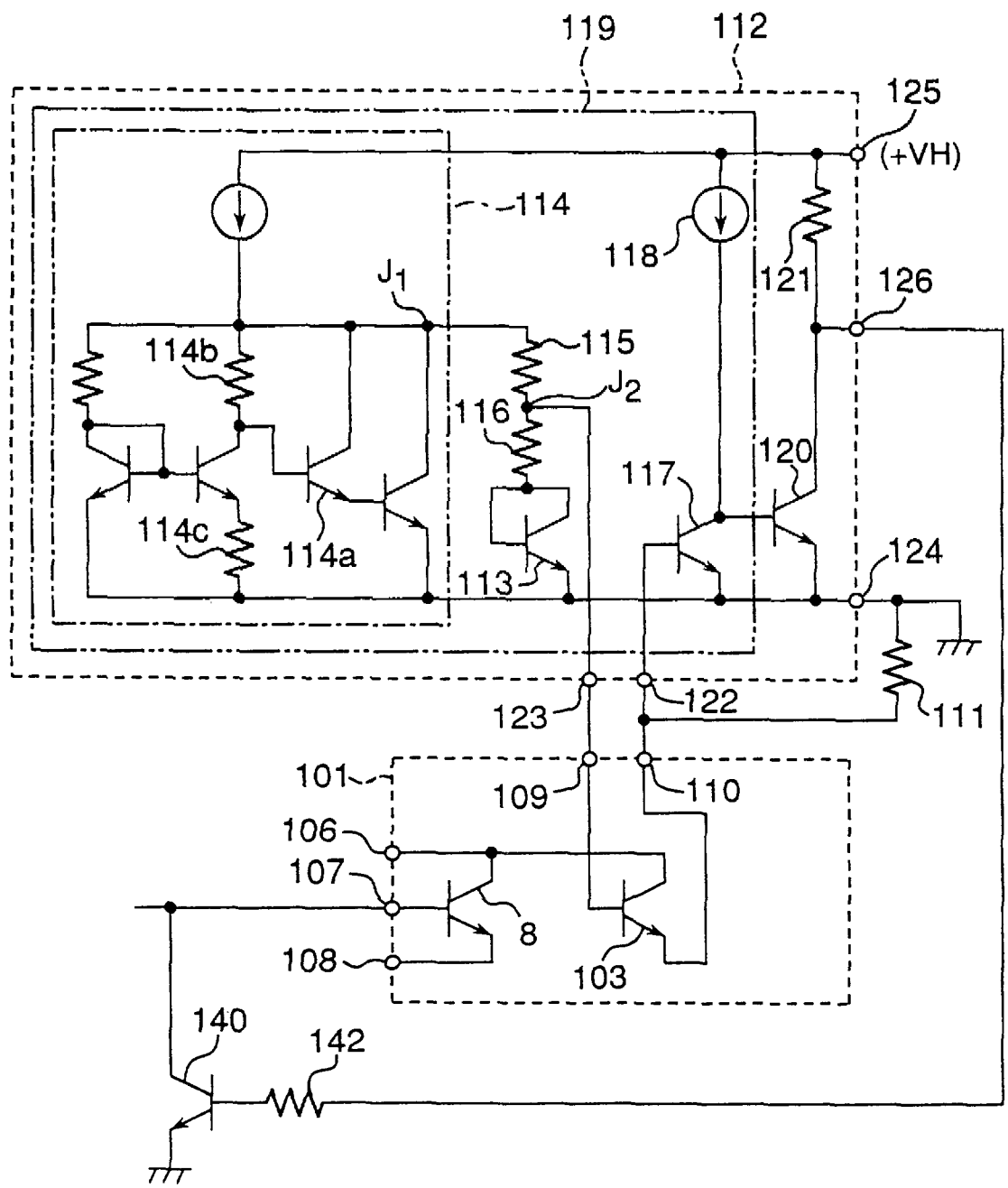
FIGS. 4 and 5 are circuit diagrams respectively showing temperature control systems for detecting a temperature of power transistors.

Referring to FIG. 4, an NPN silicon chip 101 has a power transistor 8 and a temperature detection transistor 103. The temperature detection transistor 103 is located closely adjacent the power transistor 8 and produces a base-emitter voltage which changes proportionally to the temperature change of the transistor 8. The power transistor 8 has a collector terminal 106, a base terminal 107 and an emitter terminal 108. The temperature detection transistor 103 has a base terminal 109, an emitter terminal 110 and a collector terminal 106, in which the collector terminal 106 is commonly used with the collector terminal 106 of the power transistor 2.

The temperature detector 112 is formed in a separate silicon chip from the NPN silicon chip 101, and has a power receiving terminal 125 for receiving a predetermined voltage +VH, a ground terminal 124 connected to ground and an output terminal 126. The temperature detector 112 comprises a voltage source 114 which produces from its output J1 a voltage almost equal to a constant voltage (e.g. 1.9 volts), but slightly dependent on temperature change. Such a voltage source 114 is similar to a circuit known as a band gap reference circuit, but differs in the provision of transistor 114a. Thus, the circuit 114 is herein referred to as a quasi band gap reference circuit. The output at junction J1, which is the output of the quasi band gap reference circuit, is connected through resistors 115 and 116 to a compensation transistor 113. The transistor 113 has its base and collector connected together so that the transistor 113 serves as a diode. Thus, a junction J2 between resistors 115 and 116 produces nearly a constant voltage. The circuit defined by a block 119 defines a base-emitter voltage detector for detecting the base-emitter voltage of the transistor 103. Output terminal 126 is connected through a resistor 142 to a base of transistor 140. The collector of transistor 140 is connected to the base of power transistor 8 through terminal 107.

A constant current source 118 and a transistor 117 are connected between terminals 125 and 124, and also a pull-up resistor 121 and a transistor 120 are connected between the same. The base of the transistor 117 is connected to a terminal 122 and the junction J2 is connected to terminal 123. An externally provided resistor 111 is connected between terminals 122 and 124 for adjusting the offset voltage. Terminals 122 and 110 are connected together, and terminals 123 and 109 are connected together. Thus, the base-emitter voltage of the temperature detection transistor 103 appears between terminals 123 and 122, i.e., between the junction J2 and the base of transistor 117.

Transistors 113 and 117 are located closely adjacent to each other in the IC chip and have identical characteristics so that the transistors 113 and 117 behave in the same manner with respect to temperature change. Thus, with respect to the temperature change, the voltage variation at the base of transistor 113 will be exactly the same as the voltage variation at the base of transistor 117, if both transistors 113 and 117 are supplied with the same voltage. It is noted that the term "voltage variation" used herein is to mean a voltage variation caused solely by temperature change and can be expressed by a $\Delta V/\Delta T$ in which V is voltage and T is temperature. In this case, the voltage variation at junction J2 will not be exactly the same as the voltage variation at the at base of transistor 117. To have a voltage variation at junction J2 exactly the same as that at the base of transistor 117, the voltage at junction J1 should be slightly varied with respect to temperature. For this purpose, transistor 114a is inserted in the so-called band gap reference circuit. Resistors 114b and 114c serve as adjusting elements. Thus, by the voltage source 114, the voltage variation at junction J2 and that at the base of transistor 117 are made exactly the same. Thus, if the circuit is open between terminals 122 and 123, the voltage difference between terminals 122 and 123 is constant regardless of the temperature change. As apparent from the above, transistor 113 compensates the voltage variation in transistor 117.

Since transistor 103 is connected between junction J2 and the base of transistor 117, base of transistor 117 receives a sum voltage of a voltage, $\{V(J2)+T\cdot\Delta V/\Delta T\}$, at junction J2 plus the voltage, $-V_{be}(103)$, across transistor 103, which varies relatively to temperature. In other words, the voltage $V_b(117)$ at the base of transistor 117 can be expressed as $$V_b(117)=\{V(J2)+T\cdot\Delta V/\Delta T\}-V_{be}(103) \tag{1}$$

Transistor 117 is an ON-OFF transistor switched at a predetermined threshold voltage Vth, $$V_{th}=V_{to}+T\cdot\Delta V/\Delta T, \tag{2}$$

which is also temperature dependent. In other words, transistor 117 is switched ON when $$V_b(117)>V_{th}. \tag{3}$$

This can be expressed as:

$$\{V(J2)+T\cdot\Delta V/\Delta T\}-V_{be}(103)>V_{to}+T\cdot\Delta V/\Delta T \tag{4}$$

thus, $$V_{be}(103)<V(J2)-V_{to}. \tag{5}$$

In other words, transistor 117 switches only with respect to the voltage $V_{be}(103)$ of transistor 103 and receives no influence by the temperature change. More specifically, transistor 117 switches ON when the voltage $V_{be}(103)$ becomes smaller than a predetermined voltage, $V(J2)-V_{to}$.

A temperature protected power transistor circuit thus comprised operates as described below.

The collector loss of power transistor 8 occurring during normal operation is presented in a form of heat from the silicon chip 101 through the copper collector terminal 106 and dissipated. This heat is also transmitted to the temperature detection transistor 103 formed on the same silicon chip.

The base-emitter voltage $V_{be}(103)$ of the temperature detection transistor 103 varies almost linearly with respect to temperature (approximately −2 mV to −2.5 mV/°C.) of transistor 103, and thus functions as a good temperature sensor, detecting changes in the temperature of the transmitted heat. As the temperature of transistor 103 increases, the base-emitter voltage $V_{be}(103)$ of the temperature detection transistor 103 becomes small. When the base-emitter voltage $V_{be}(103)$ becomes smaller than a predetermined voltage given by the above formula (5), transistor 117 turns on. Thus, transistor 120 turns off to produce a HIGH level signal from terminal 126. Thus, transistor 140 turns on to forcibly connecting the base of the power transistor to ground to turning off the power transistor 8. Thus, the overheat of the power transistor 8 can be prevented.

After a while, when the temperature of the power transistor 8 becomes low, the base-emitter voltage $V_{be}(103)$ of the temperature detection transistor 103 becomes greater than the predetermined voltage. Thus, transistor 117 turns off. And, in turn, transistor 120 turns on to produce a LOW level signal from terminal 126. Thus, transistor 140 turns off to operate the power transistor 8 according to the signal applied to its base from a driving circuit (not shown).

Since power transistor 8 is protected from overheating, the power transistor 8 will not be damaged by overheating. Also, when the power transistor 8 is disabled by the turn on of transistor 140 to cut the power supply from the power source V1, the five power amplifiers 19A, 19B, 19C, 19D and 19E still continues to produce audio signal by the low voltage power +VL from the power source V2.

The temperature control system for the power transistor 12 comprises a temperature detector 212, a temperature detector transistor 203, and a switching transistor 240, a detail of which is herein described in connection with FIG. 5.

Figure 5:
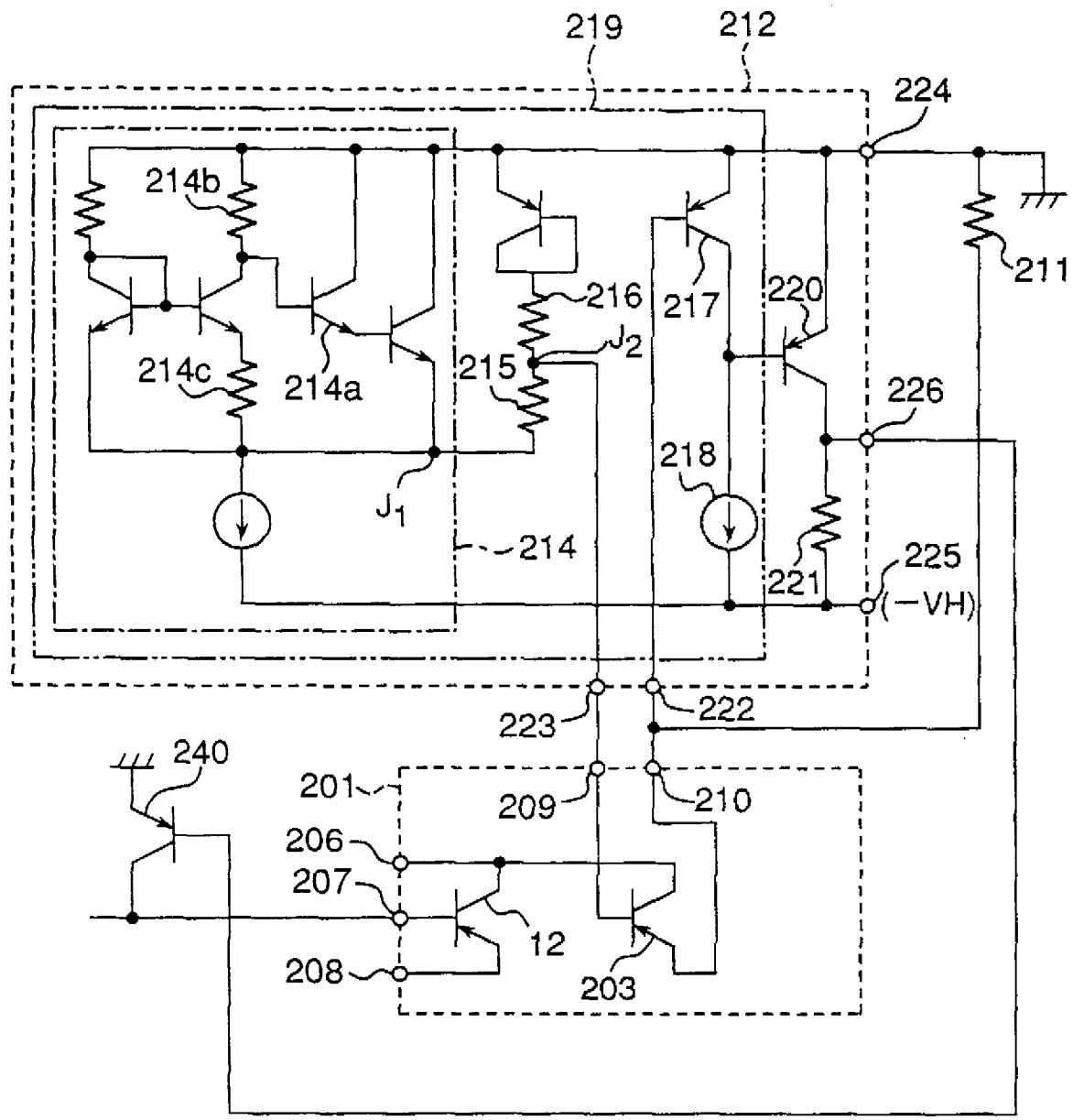

Referring to FIG. 5, an PNP silicon chip 201 has a power transistor 12 and a temperature detection transistor 203. The power transistor 12 has a collector terminal 206, a base terminal 207 and an emitter terminal 208. The temperature detection transistor 203 has a base terminal 209, an emitter terminal 210 and a collector terminal 206.

The temperature detector 212 is formed in a separate silicon chip from the PNP silicon chip 201, and has a power receiving terminal 225 for receiving a predetermined voltage −VH, a ground terminal 224 connected to ground and an output terminal 226. The temperature detector 212 comprises a voltage source 214 which produces from its output J1 a voltage almost equal to a constant voltage (e.g. 1.9 volts), but slightly dependent on temperature change, and has a transistor 214a. The output at junction J1 is connected through resistors 215 and 216 to a compensation transistor 213. The circuit defined by a block 219 defines a base-emitter voltage detector for detecting the base-emitter voltage of the transistor 203. Output terminal 226 is to a base of transistor 240. The collector of transistor 240 is connected to the base of power transistor 12 through terminal 207.

A constant current source 218 and a transistor 217 are connected between terminals 225 and 224, and also a pull-up resistor 221 and a transistor 220 are connected between the same. The base of the transistor 217 is connected to a terminal 222 and the junction J2 is connected to terminal 223. An externally provided resistor 211 is connected between terminals 222 and 224 for adjusting the offset voltage. Terminals 222 and 210 are connected together, and terminals 223 and 209 are connected together. Thus, the base-emitter voltage of the temperature detection transistor 203 appears between terminals 223 and 222, i.e., between the junction J2 and the base of transistor 217.

A detail of the temperature control system is disclosed in U.S. Ser. No. 08/249256 filed May 25, 1994, which issued as U.S. Pat. No. 5,543,998 on Aug. 6, 1996 in the name of K. HIGASHIYAMA, entitled "TEMPERATURE PROTECTED POWER TRANSISTOR CIRCUIT", which is herein incorporated by reference.

Second Embodiment

Figure 7:
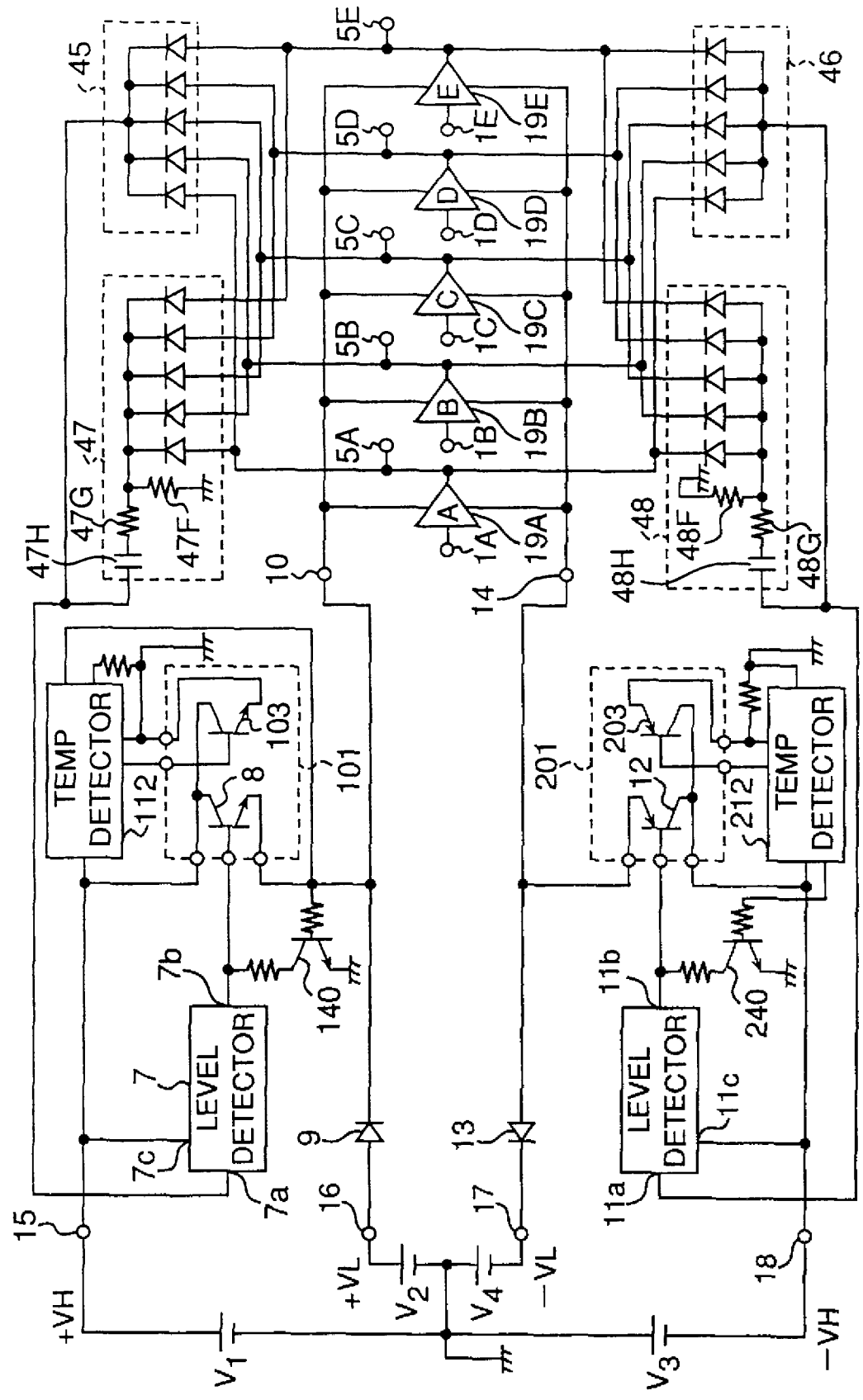
FIG. 7 is a circuit diagram of a power amplifier arrangement according to a second embodiment of the present invention.

Referring to FIG. 7, a power amplifier arrangement according to the second embodiment of the present invention is shown. What differs from the first embodiment of FIG. 1 is that a third and fourth diode arrays 47 and 48 are provided in parallel to the first and second diode arrays 45 and 46, respectively. The third diode array 47 has five diodes connected to the five outputs 5A, 5B, 5C, 5D and 5E of five power amplifiers 19A, 19B, 19C, 19D and 19E, respectively, and serves as a frequency-dependent positive peak detection circuit. The fourth diode array 48 is arranged similar to the third diode array 47 and serves as a frequency-dependent negative peak detection circuit. The description is particularly directed to the third diode array 47. The outputs of the five diodes are connected together and in turn to resistor 47G and capacitor 47H in series. The outputs are also connected through a resistor 47F to ground. These resistors 47F and 47G and capacitor 47H define a high pass filter. Thus, when any of the output signals from terminals 5A–5E has a high frequency, such as 20 kHz as shown by a sine curve S5 in FIG. 8, the output from the first diode array 45 or the second diode array 46 would vary in the same high frequency, but the output from the third diode array 47 or the fourth diode array 48 would vary at a lower frequency.

Figure 8:
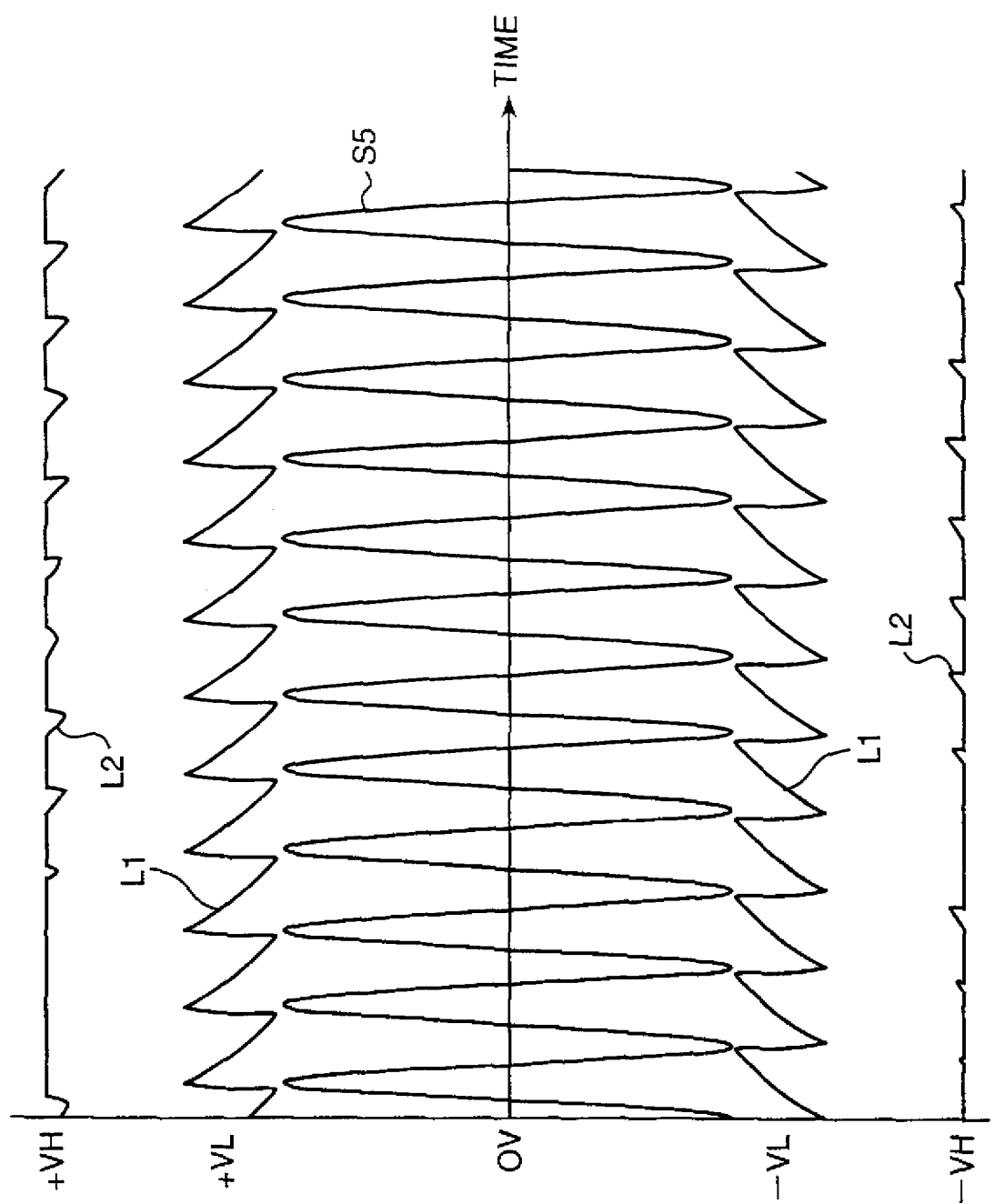
FIG. 8 is a graph showing waveforms in connection with the circuit of FIG. 7.

If the third diode array 47 and the fourth diode array 48 are not provided, the high frequency output signals from terminals S5–5E will cause a rapid change of the power in the power line 10 or 14, so that the supply power stays more often close to the low voltage power ±VL than the high voltage power ±VH, as shown by lines L1 in FIG. 8. However, by providing the third diode array 47 and fourth diode array 48, the power in the power line 10 or 14 becomes more stable such that the supply power stays more often close to the high voltage power ±VH than the low voltage power ±VL, as shown by lines L2 in FIG. 8.

Thus, with the use of the third and fourth diode arrays 47 and 48, it is possible to provide a sufficient power to each of the five power amplifiers 19A–19E, and yet the overheating of the power transistors 8 and 12 can be prevented. Also, a high fidelity operation across the audio frequency range from approximately 20 Hz to 20 kHz can be realized.

Third Embodiment

Figure 9:
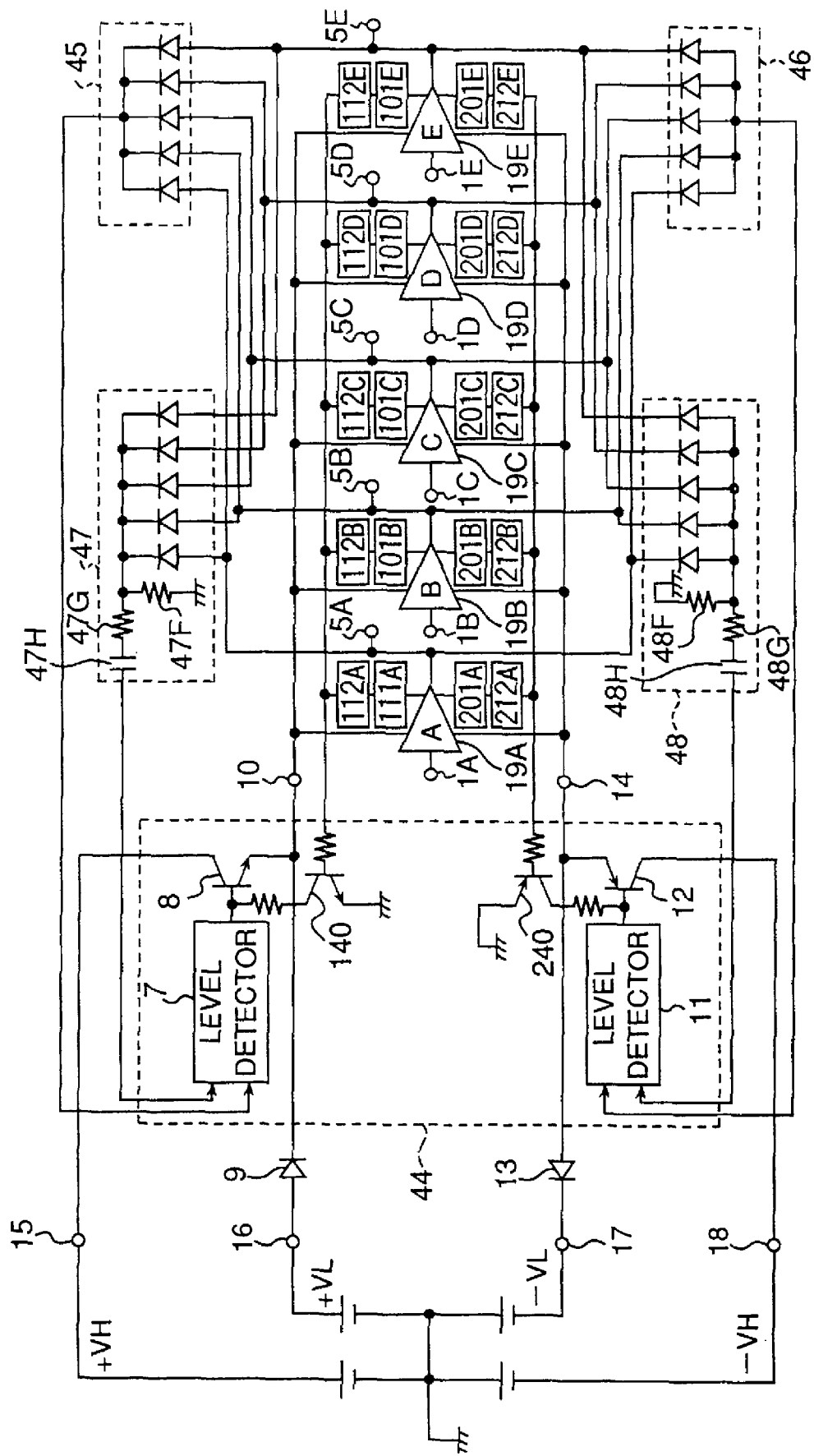
FIG. 9 is a circuit diagram of a power amplifier arrangement according to a third embodiment of the present invention.

Referring to FIG. 9, a power amplifier arrangement according to the third embodiment of the present invention is shown. What differs from the second embodiment of FIG. 7 is that the temperature control system is provided in association with power transistors 3 and 4, instead of the power transistors 8 and 12. As described above in connection with FIG. 6, each of the five power amplifiers 19A–19E has power transistors 3 and 4 which are coupled with the temperature detection transistors 103 and 203, respectively, as described below.

Figure 10:
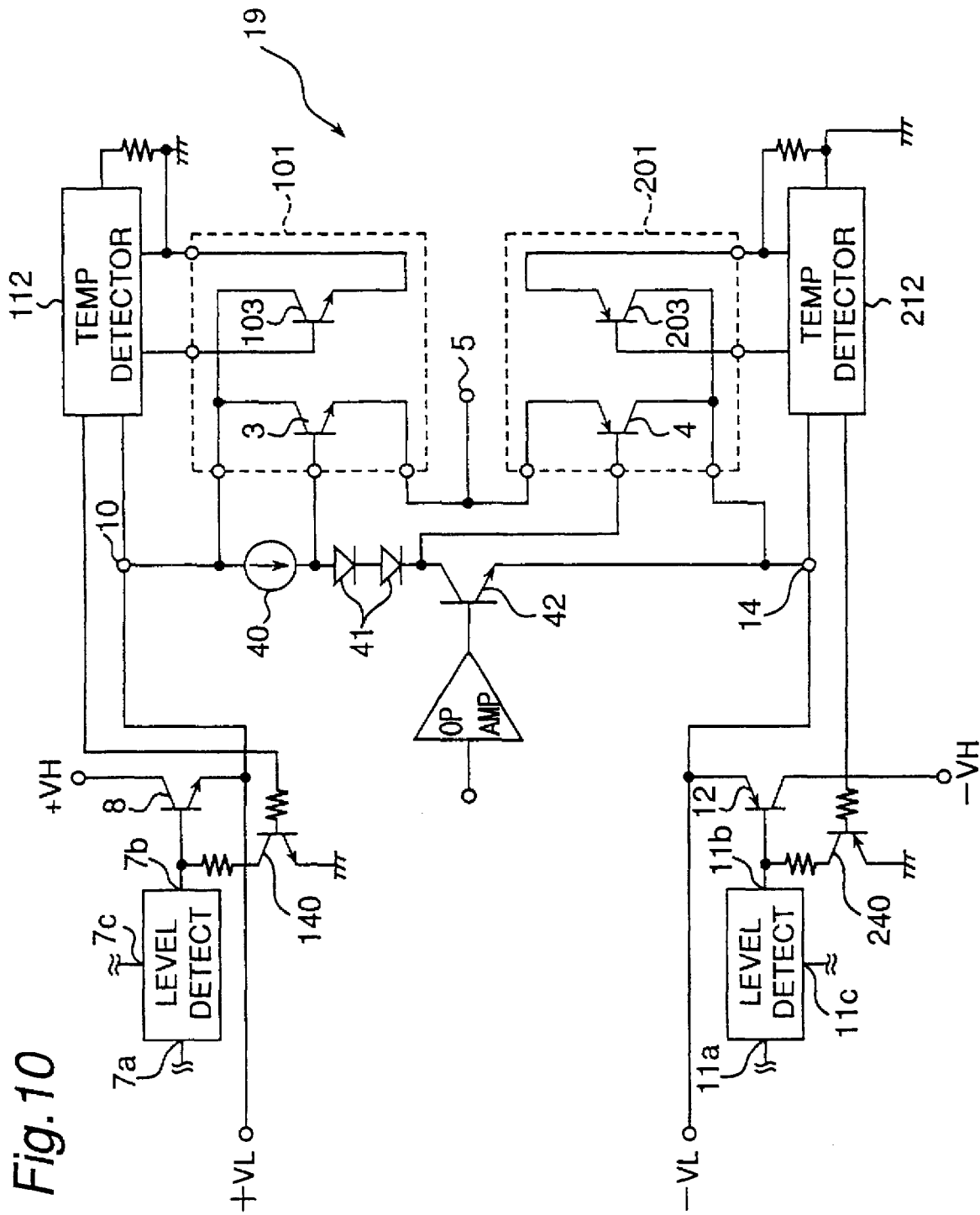
FIG. 10 is a circuit diagram of a power amplifier with a temperature control system.

Referring to FIG. 10, a detail of each power amplifier associated with the temperature control system is shown, and is generally indicated by reference number 19. An NPN silicon chip 101' has the power transistor 3 and a temperature detection transistor 103'. The NPN silicon chip 101' is coupled with the temperature detector 112. The output of the temperature detector 112 is connected to the switching transistor 140 which enables or disables the power transistor 8, as described above.

When the power transistor 3 is supplied with a high voltage power +VH through the power transistor 8, the temperature of the power transistor 3 may exceeds a predetermined temperature as detected by the temperature detection transistor 103' and the temperature detector 112. If this happens, a HIGH level signal is applied to the base of transistor 140 to forcibly ground the base of the power transistor 8. Thus, the power transistor 8 is disabled and maintained in off state regardless of any signal from the level detector 7. Thus, the power transistor 3 is not any more supplied with a high voltage power +VH, but is supplied with a low voltage power +VL. Thus, without intercepting the output signal from terminal 5, the power transistor 3 can be cooled down by the low voltage power +VL, and can be protected from being destroyed by the overheat.

A similar arrangement is provided for the power transistor 4. Specifically, an PNP silicon chip 201' has the power transistor 4 and a temperature detection transistor 203'. The PNP silicon chip 201' is coupled with the temperature detector 212. The output of the temperature detector 212 is connected to the switching transistor 240 which enables or disables the power transistor 12.

Figure 11:
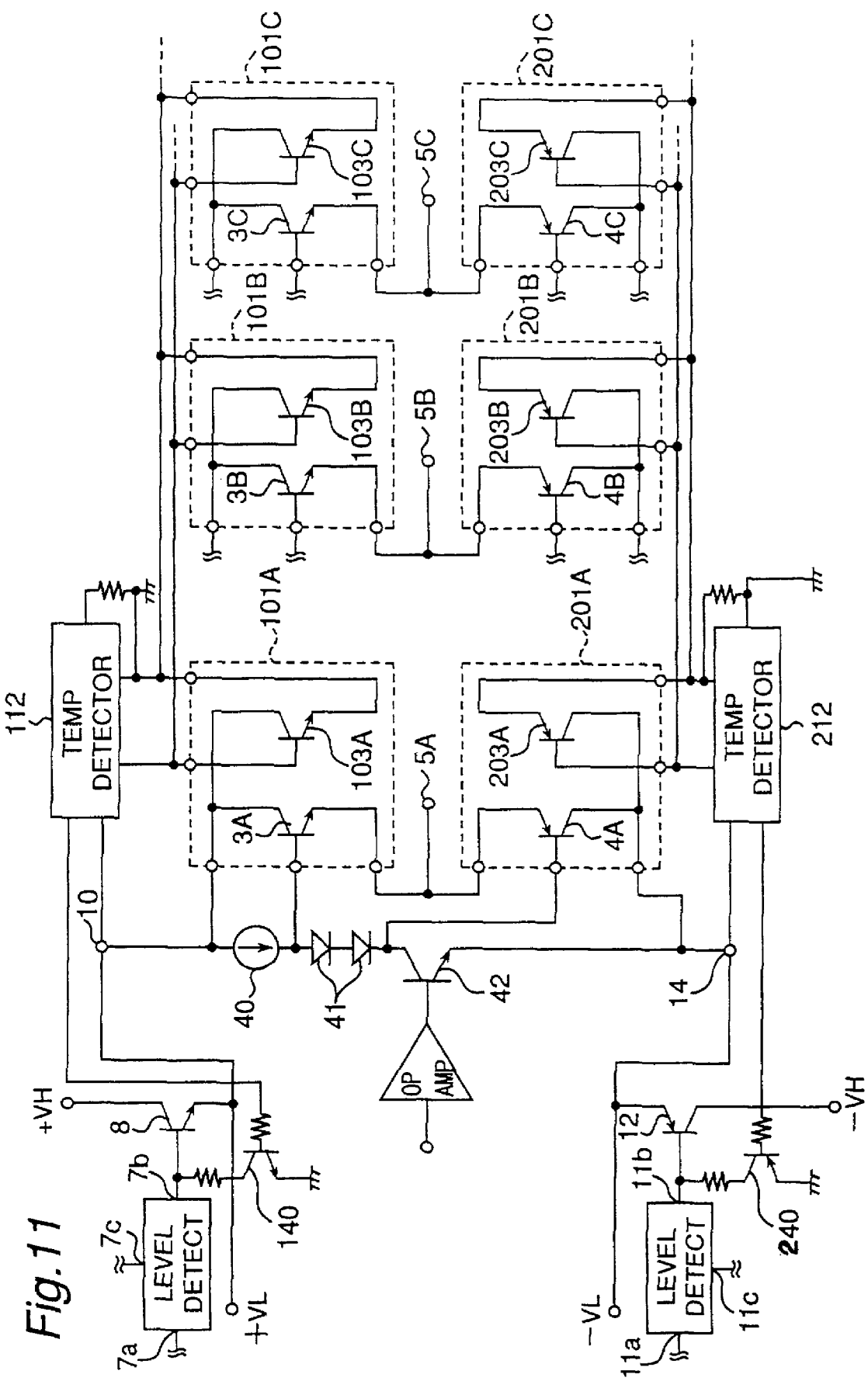
FIG. 11 is view similar to FIG. 10, but showing a modification thereof.

Referring to FIG. 11, a modification of the third embodiment is shown. Instead of providing the temperature detectors 112 and 212 to each of the power amplifiers 19A–19E, it is possible to provided only one set of each of the temperature detectors 112 and 212 and connect the NPN silicon chips 101A, 101B, 101C, 101D and 101E to one common temperature detector 112, and similarly, connect the PNP silicon chips 201A, 201B, 201C, 201D and 201E to one common temperature detector 212.

Specifically, each NPN silicon chip 101A to 101E includes a respective temperature detection transistor 103A to 103E and a respective positive power transistor 3A to 3E. In a similar manner, each PNP silicon chip 201A to 201E includes a respective temperature detection transistor 203A to 203E and a respective negative power transistor 4A to 4E.

Based upon this arrangement, the plurality of temperature detection transistors 203A to 203E are respectively coupled to the plurality of negative side power transistors 4A to 4E, with the plurality of negative side power transistors 4A to 4E being connected in parallel to the temperature detection circuit 212. Similarly, the plurality of temperature detection transistors 103A to 103E are respectively coupled to the plurality of positive side power transistors 3A to 3E, with the plurality of positive side power transistors 3A to 3E being connected in parallel to the temperature detection circuit 112.

Furthermore, since the positive half side signal as controlled by the power transistor 3A and the negative half side signal as controlled by the power transistor 3B are generally symmetrical, it is possible to eliminate the temperature control systems provided in association with the negative side power transistors 4A, 4B, 4C, 4D and 4E, and use the output signal from the temperature detector 112 for controlling not only the switching transistor 140, but also the switching transistor 240.

More over, since the output power is consumed most in the front left, front right or front center speakers, it is possible to provide only one temperature control system to one power amplifier associated with one of the three front speakers.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A power amplifier arrangement, comprising:

a plurality of power amplifiers;

a first level detector that detects a level of a positive peak value of outputs from said plurality of power amplifiers, said first level detector producing a first control signal when said positive peak value exceeds a predetermined positive level;

a first power transistor turned on and off in response to a presence and absence of said first control signal, respectively;

a second level detector that detects a level of a negative peak value of outputs from said plurality of power amplifiers, said second level detector producing a second control signal when said negative peak value exceeds a predetermined negative level;

a second power transistor turned on and off in response to a presence and absence of said second control signal, respectively;

a first power source that supplies a high positive voltage power to said plurality of power amplifiers through said first power transistor;

a second power source that supplies a low positive voltage power to said plurality of power amplifiers;

a third power source that supplies a high negative voltage power to said pluraliy of power amplifiers through said second power transistor;

a fourth power source that supplies a low negative voltage power to said power amplifiers;

a first temperature detector that detects a temperature of said first power transistor, said first temperature detector producing a first disabling signal when said detected temperature of said first power transistor is greater than a predetermined temperature; and a first disabling device that disables said first power transistor in response to said first disabling signal by said first temperature detector.

2. The power amplifier arrangement of claim 1, further comprising:

a second temperature detector that detects a temperature of said second power transistor, said second temperature detector producing a second disabling signal when said detected temperature of said second power transistor is greater than a predetermined temperature; and a second disabling device that disables said second power transistor in response to said second disabling signal by said second temperature detector.

3. The power amplifier arrangement of claim 1, further comprising:

a first diode array, connected to said first level detector and said plurality of power amplifiers, that detects a positive peak value of said plurality of power amplifiers; and a second diode array, connected to said second level detector and said plurality of power amplifiers, that detects a negative peak value of said plurality of power amplifiers.

4. The power amplifier arrangement of claim 3, further comprising:

a third diode array, connected in parallel to said first diode array, that detects a positive peak value of said plurality of power transistors, said third diode array comprising a first high pass filter; and a fourth diode array, connected in parallel to said second diode array, that detects a negative peak value of said plurality of power amplifiers, said fourth diode array comprising a second high pass filter.

5. A power amplifier arrangement, comprising:

a plurality of power amplifiers, each power amplifier of said plurality of power amplifiers comprising a positive side power transistor and a negative side power transistor;

a first level detector that detects a level of a positive peak value of outputs from said plurality of power amplifiers, said first level detector producing a first control signal when said positive peak value exceeds a predetermined positive level;

a first power transistor turned on and off in response to a presence and absence of said first control signal, respectively;

a second level detector that detects a level of a negative peak value of outputs from said plurality of power amplifiers, said second level detector producing a second control signal when said negative peak value exceeds a predetermined negative level;

a second power transistor turned on and off in response to a presence and absence of said second control signal, respectively;

a first power source that supplies a high positive voltage power to said plurality of power amplifiers through said first power transistor;

a second power source that supplies a low positive voltage power to said plurality of power amplifiers;

a third power source that supplies a high negative voltage power to said pluralty of power amplifiers through said second power transistor;

a fourth power source that supplies a low negative voltage power to said power amplifiers;

a first temperature detector that detects a temperature of said positive side power transistor of at least one power amplifier, said first temperature detector producing a first disabling signal when said detected temperature of said first power transistor is greater than a first predetermined temperature; and a first disabling device that disables said first power transistor in response to said first disabling signal by said first temperature detector.

6. The power amplifier arrangement of claim 5, wherein said first temperature detector comprises a temperature detection transistor coupled to said positive side power transistor, and a temperature detection circuit connected to said temperature detection transistor.

7. The power amplifier arrangement of claim 6, wherein said temperature detection transistor comprises a plurality of temperature detection transistors, and said positive side power transistor comprises a plurality of positive side power transistors, said plurality of temperature detection transistors being respectively coupled to said plurality of positive side power transistors in said plurality of power amplifiers, said plurality of positive side power transistors being connected in parallel to said temperature detection circuit.

8. The power amplifier arrangement of claim 7, wherein said temperature detection transistor comprises a plurality of temperature detection transistors, and said negative side power transistor comprises a plurality of negative side power transistors, said plurality of temperature detection transistors being respectively coupled to said plurality of negative side power transistors in said plurality of power amplifiers, said plurality of negative side power transistors being connected in parallel to said temperature detection circuit.

9. The power amplifier arrangement of claim 5, further comprising:

a second temperature detector that detects a temperature of said negative side power transistor of at least one power amplifier of said plurality of power amplifiers, said second temperature detector producing a second disabling signal when said detected temperature of said negative side power transistor is greater than a second predetermined temperature; and a second disabling device that disables said second power transistor in response to said second disabling signal by said second temperature detector.

10. The power amplifier arrangement of claim 9, wherein said second temperature detector comprises a temperature detection transistor coupled to said negative side power transistor of at least one power amplifier of said plurality of power amplifiers, and a temperature detection circuit connected to said temperature detection transistor.

11. A power amplifier arrangement, comprising:

a plurality of power amplifiers;

first means for detecting a level of a positive peak value of outputs from said plurality of power amplifiers, said first detecting means producing a first control signal when said positive peak value exceeds a predetermined positive level;

a first power transistor selectively turned on in response to a presence of said first control signal;

second means for detecting a level of a negative peak value of outputs from said plurality of power amplifiers, said second detecting means producing a second control signal when said negative peak value exceeds a predetermined negative level;

a second power transistor selectively turned on in response to a presence of said second control signal;

first means for supplying a high positive voltage power to said plurality of power amplifiers;

second means for supplying a low positive voltage power to said plurality of power amplifiers;

third means for supplying a high negative voltage power to said plurality of power amplifiers;

fourth means for supplying a low negative voltage power to said power amplifiers;

first means for detecting a temperature of said first power transistor to produce a first disabling signal when said detected temperature exceeds a predetermined temperature; and first means for disabling said first power transistor in response to said first disabling signal.

12. The power amplifier arrangement of claim 11, further comprising:

second means for detecting a temperature of said second power transistor to produce a second disabling signal when said detected temperature exceeds a predetermined temperature; and second means for disabling said second power transistor in response to said second disabling signal.

13. The power amplifier arrangement of claim 11, wherein each amplifier of said plurality of amplifiers comprise a positive side power transistor and a negative side power transistor.

14. The power amplifier arrangement of claim 13, wherein said first temperature detecting means detects a temperature of said positive side power transistor of at least one power amplifier, of said plurality of power amplifiers, to produce said first disabling signal.

15. The power amplifier arrangement of claim 14, further comprising:

second means for detecting a temperature of said negative side power transistor of said at least one power amplifier to produce a second disabling signal when said temperature of said negative side power transistor, detected by said second temperature detecting means, exceeds a second predetermined temperature; and second means for disabling said second power transistor in response to said second disabling signal.

* * * * *

UNITED STATES PATENT AND TRADEMARK OFFICE
CERTIFICATE OF CORRECTION

PATENT NO. : 5,818,301
DATED : October 6, 1998
INVENTOR(S) : K. HIGASHIYAMA et al.

It is certified that error appears in the above-identified patent and that said Letters Patent is hereby corrected as shown below:

On the cover page of the printed patent at item [54] in the Title, "ARRANGENMENT" should be --ARRANGEMENT--.

Signed and Sealed this

Eighth Day of February, 2000

Attest:

Q. TODD DICKINSON

*Attesting Officer*         *Commissioner of Patents and Trademarks*